(12) United States Patent
Hong

(10) Patent No.: US 7,037,784 B1
(45) Date of Patent: May 2, 2006

(54) METHOD OF FORMING FLOATING GATE ELECTRODE OF FLASH MEMORY DEVICE

(75) Inventor: Young Ok Hong, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/141,326

(22) Filed: Jun. 1, 2005

(30) Foreign Application Priority Data

Dec. 28, 2004 (KR) .................. 10-2004-0114136

(51) Int. Cl.
*H01L 21/336* (2006.01)
(52) U.S. Cl. ..................................... 438/257; 438/266
(58) Field of Classification Search ............. 438/257, 438/266
See application file for complete search history.

(56) References Cited

U.S. PATENT DOCUMENTS 6,642,110 B1 * 11/2003 Jung et al. ................. 438/264

* cited by examiner

*Primary Examiner*—Jack Chen
(74) *Attorney, Agent, or Firm*—Mayer, Brown, Rowe & Maw LLP

(57) ABSTRACT

The present invention relates to a method of forming a floating gate electrode of a flash memory device. According to the present invention, the method includes the steps of forming a first silicon film for floating gate electrode and a pad nitride film on a semiconductor substrate, and patterning the pad nitride film, the first silicon film and a predetermined region of the semiconductor substrate to define trenches, forming buried insulation films in the defined trenches, and then performing a polishing process until the pad nitride film is exposed, thereby completing a process of forming isolation films, removing the patterned pad nitride film, and forming second silicon films for floating gate electrodes in the regions from which the pad nitride films are removed, and forming patterns for forming cylinder-shaped floating gate electrodes on the second silicon films, and performing an etch process on the second silicon films using the patterns as etch masks to form the cylinder-shaped floating gate electrode patterns on the first silicon films for floating gate electrodes.

4 Claims, 4 Drawing Sheets

METHOD OF FORMING FLOATING GATE ELECTRODE OF FLASH MEMORY DEVICE

BACKGROUND

1. Field of the Invention

The present invention relates to a method of manufacturing semiconductor device, and more specifically, to a method of forming a floating gate electrode of a flash memory device.

2. Discussion of Related Art

Generally, in a method of manufacturing a flash memory device, a dielectric film is formed between a floating gate electrode and a control gate electrode. Recently, as flash memory devices gradually become higher integrated and dense, a bridge is generated between the floating gate electrodes and a dielectric film is not deposited between floating gate electrode patterns due to the shortage of a spacer between the floating gate electrode patterns. Therefore, there is a problem in that the coupling ratio significantly increases.

SUMMARY OF THE INVENTION

Accordingly, the present invention has been made in view of the above problems, and it is an object of the present invention to provide a method of forming a floating gate electrode of a flash memory device, wherein generation of a bridge between floating gate electrodes is prohibited, and the coupling ratio is increased.

To achieve the above object, according to the present invention, there is provided a method of forming a floating gate electrode of a flash memory device, including the steps of forming a first silicon film for floating gate electrode and a pad nitride film on a semiconductor substrate, and patterning the pad nitride film, the first silicon film and a predetermined region of the semiconductor substrate to define trenches, forming buried insulation films in the defined trenches, and then performing a polishing process until the pad nitride film is exposed, thereby completing a process of forming isolation films, removing the patterned pad nitride film, and forming second silicon films for floating gate electrodes in the regions from which the pad nitride films are removed, and forming patterns for forming cylinder-shaped floating gate electrodes on the second silicon films, and performing an etch process on the second silicon films using the patterns as etch masks to form the cylinder-shaped floating gate electrode patterns on the first silicon films for floating gate electrodes.

The cylinder-shaped floating gate electrode patterns can be located between the isolation films, which are regions from which the pad nitride films are removed.

The method preferably further includes the step of forming a dielectric film on the entire surface including the cylinder-shaped floating gate electrode patterns.

The dielectric film can be formed to be in contact with top portions and lateral portions of the cylinder-shaped floating gate electrodes.

DETAILED DESCRIPTION OF PREFERRED EMBODIMENTS

Figure 1:
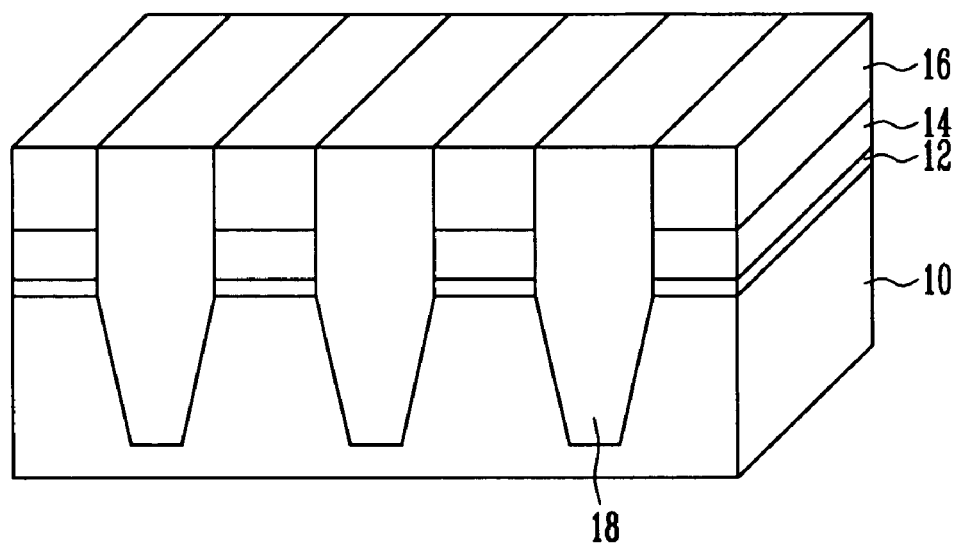
FIGS. 1 to 5 are perspective views for explaining a method of forming a floating gate electrode of a flash memory device according to the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

FIGS. 1 to 5 are perspective views for explaining a method of forming a floating gate electrode of a flash memory device according to the present invention.

Referring to FIG. 1, a gate oxide film 12, a first polysilicon film 14 for floating gate electrode, and a pad nitride film 16 are sequentially formed on the entire surface of a semiconductor substrate 10 comprised of a silicon material. A photoresist pattern (not shown) is formed in a predetermined region on the pad nitride film 16. The pad nitride film 16, the first polysilicon film 14 for floating gate electrode, the gate oxide film 12 and a predetermined depth of the semiconductor substrate are then etched using the formed photoresist pattern (not shown) as an etch mask to define trenches.

A process of removing the photoresist pattern (not shown) for defining the trenches is performed. A buried insulation film such as a HDP oxide film is then formed on the entire surface.

A CMP process is performed on the entire surface including the buried insulation film until the pad nitride film is exposed, and the pad nitride film 16 is removed by means of wet etch process, thereby completing a process of forming isolation films 18.

Figure 2:
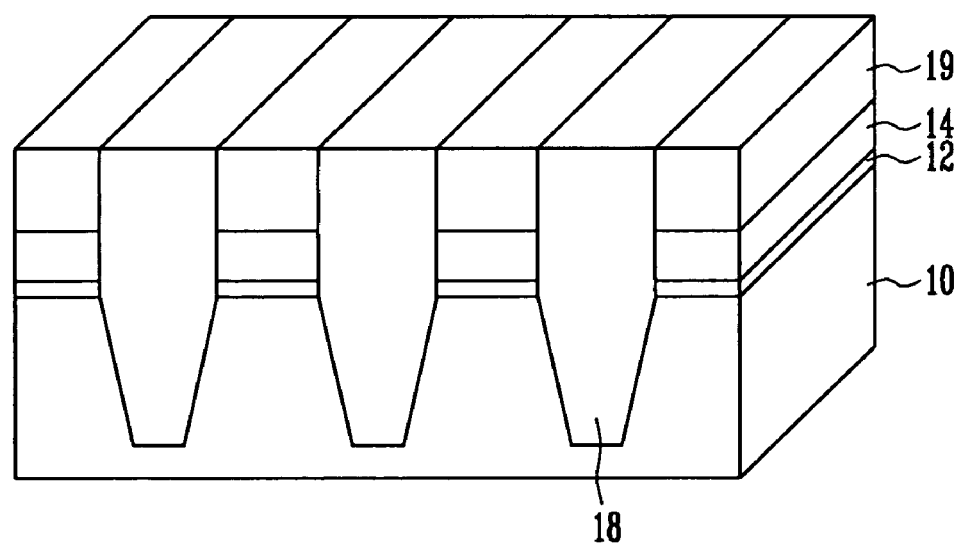

Referring to FIG. 2, second polysilicon films 19 for floating gate electrodes are formed on the region from which the pad nitride film 16 is removed. A polishing process such as CMP process is then performed until the buried insulation film of the isolation film is exposed.

Figure 3:
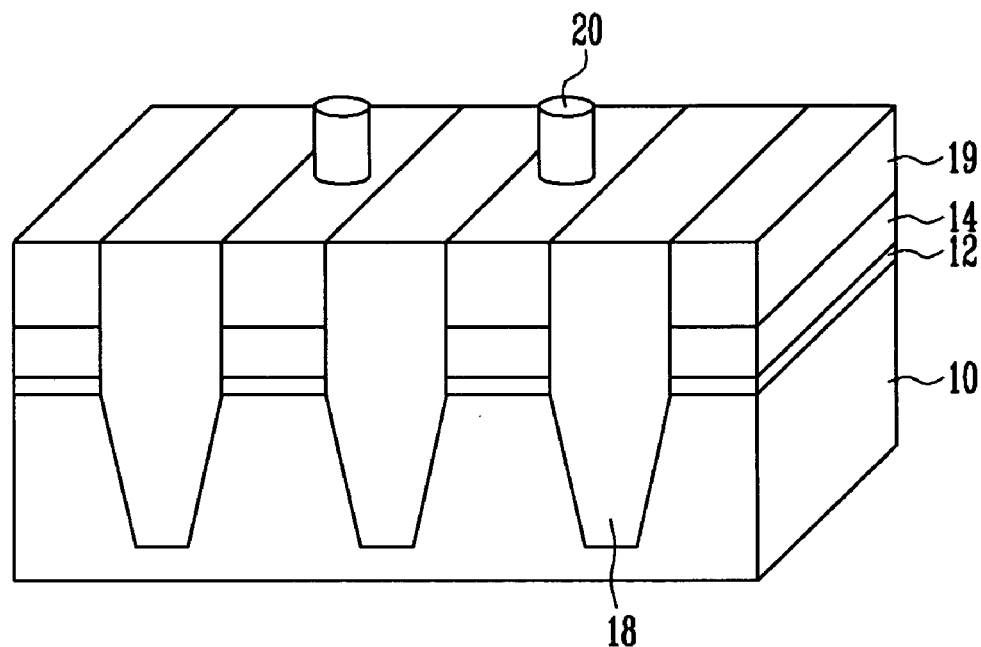

Referring to FIG. 3, photoresist patterns 20 for defining cylinder-shaped floating gate electrodes are formed on the second polysilicon films for floating gate electrode. The photoresist patterns 20 are formed on the second polysilicon films 19 for floating gate electrodes in the same shape as that of a desired cylinder-shaped floating gate electrode pattern. The photoresist patterns 20 are then used as etch masks in a subsequent etch process, thus forming the cylinder-shaped floating gate electrode patterns.

Figure 4:
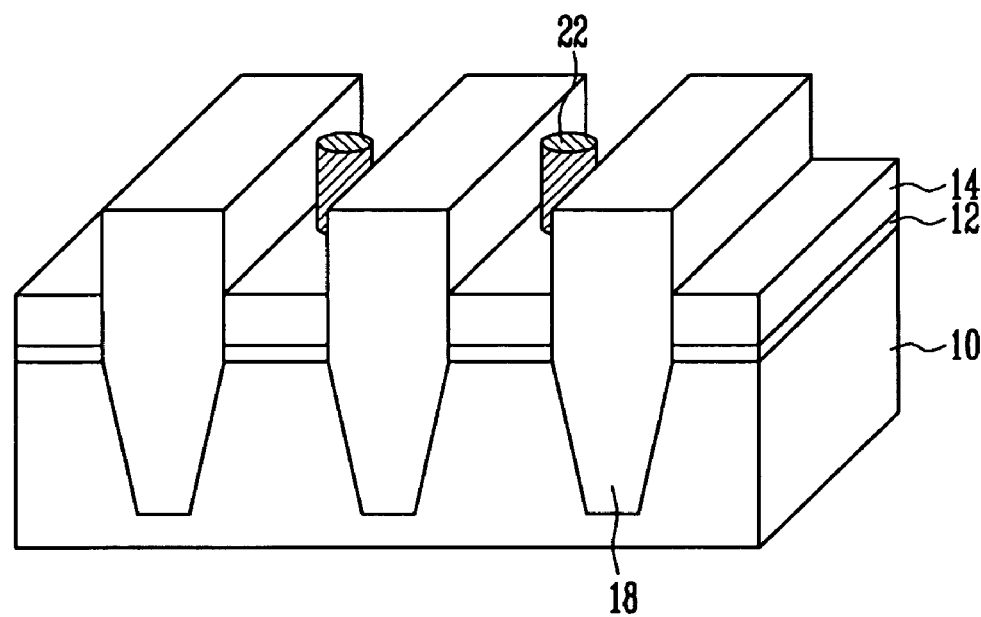

Referring to FIG. 4, an etch process using the photoresist patterns 20 as etch masks is performed to form cylinder-shaped floating gate electrode patterns 22.

The cylinder-shaped floating gate electrode patterns 22 are formed only between the isolation films, which are regions from which the pad nitride films are removed. Thus, there does not occur a phenomenon in which the second polysilicon films overlap with the isolation films, which is shown in an existing floating gate electrode formation method. Accordingly, it is possible to secure an overlay between the gate electrode patterns and thus to prevent a bridge between patterns. A process of removing the photoresist patterns 20 is then performed.

The cylinder-shaped floating gate electrode patterns cause a profile slope phenomenon to disappear in an etch process for forming the floating gate electrode patterns of a rectangular pole shape as in the prior art. Accordingly, a space between the floating gate electrodes can be reduced to further shrink the cell size, and the height of the floating gate electrode patterns can become higher than that of the prior art.

Figure 5:
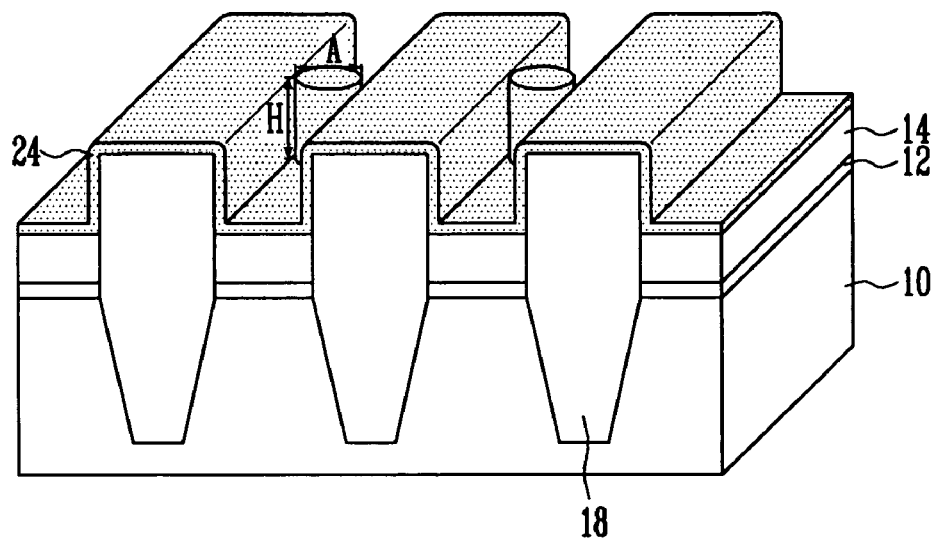

Referring to FIG. 5, an ONO (Oxide-Nitride-Oxide) film 24 is formed on the entire surface including the cylinder-shaped floating gate electrode patterns 22 using a dielectric film.

If the ONO film 24 is formed on the entire surface including the cylinder-shaped floating gate electrode patterns 22, a contact area between the ONO film and the floating gate electrode pattern can be significantly increased to improve the coupling ratio.

Figure 6:
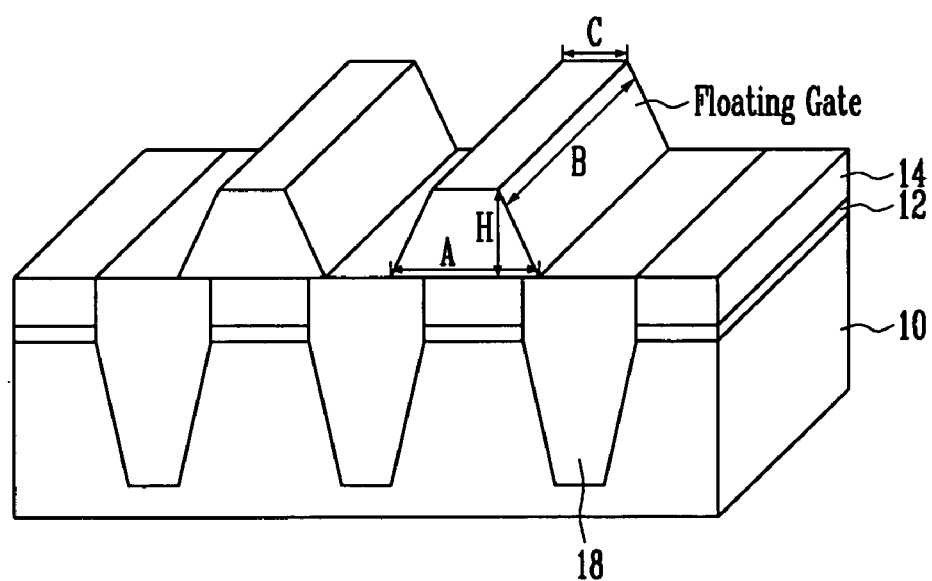
FIGS. 6 and 7 show conventional floating gate electrode patterns.
Figure 7:
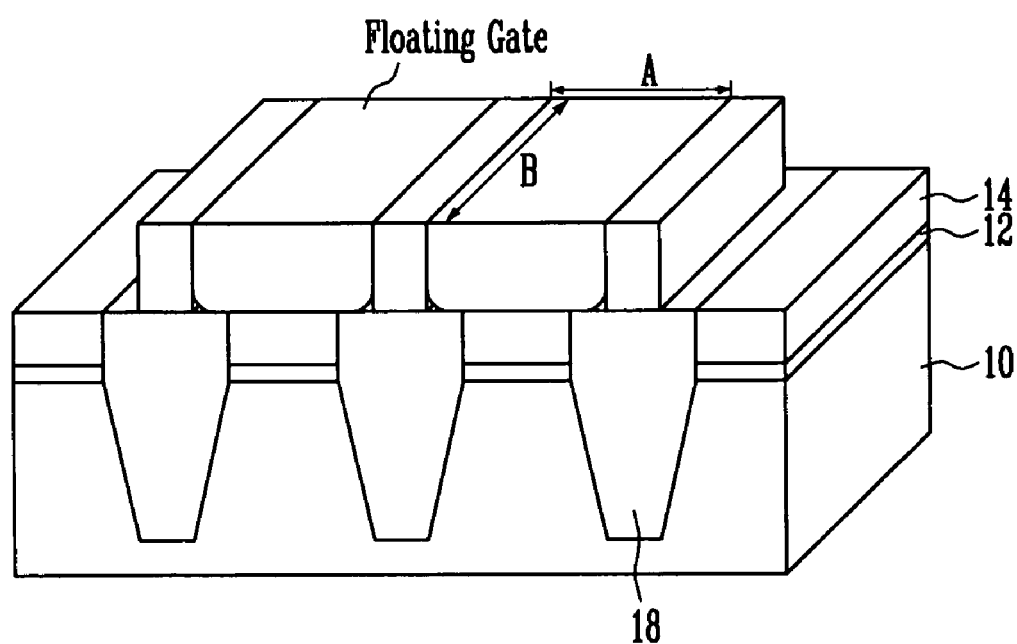

FIGS. 6 and 7 show conventional floating gate electrode patterns. A contact area between a floating gate electrode pattern and an ONO film formed thereon shown in FIG. 6 is $$(C*B) + \sqrt{(A-C)^2 + H^2}$$

(top area and lateral area). A contact area between a floating gate electrode pattern and an ONO film formed thereon shown in FIG. 7 is A*B (top area). A contact area between the cylinder-shaped floating gate electrode patterns 22 and the ONO film formed thereon according to the present invention is $\psi*(A/2)^2 + \psi*A*H$ (top area and lateral area).

As shown in Table below, assuming that A=B=H, C=0.8A, the area of the ONO film that is in contact with the cylinder-shaped floating gate electrode is $3.92A^2$, which is wider than the contact area of $1.8A^2$ (FIG. 6) and the contact are of $A^2$ (FIG. 7). That is, it can be seen that the cylinder-shaped floating gate electrode is about two times and four times greater than the trapezoid floating gate electrode pattern and the self-aligned floating gate electrode pattern, respectively.

| Floating gate scheme | Contact area | Assuming that A = B = H, C = 0.8 A |
|---|---|---|
| Trapezoid floating gate electrode (FIG. 6: Prior art) | $(C*B) + \sqrt{(A-C)^2 + H^2}$ | $1.8 A^2$ |
| Self-aligned floating gate electrode (FIG. 7: Prior art) | $A * B$ | $A^2$ |
| Cylinder-shaped floating gate electrode | $\psi * (A/2)^2 + \psi * A * H$ | $3.92 A^2$ |

As described above, according to the present invention, as cylinder-shaped floating gate electrodes are formed, a contact area between an ONO film and a floating gate electrode pattern is significantly increased. Accordingly, the present invention is advantageous in that it can improve the coupling ratio, secure an overlay between gate electrode patterns, and thus prevent a bridge between the patterns.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of forming a floating gate electrode of a flash memory device, comprising the steps of:

forming a first silicon film for floating gate electrode and a pad nitride film on a semiconductor substrate, and patterning the pad nitride film, the first silicon film and a predetermined region of the semiconductor substrate to define trenches;

forming buried insulation films in the defined trenches, and then performing a polishing process until the pad nitride film is exposed, thereby completing a process of forming isolation films;

removing the patterned pad nitride film, and forming second silicon films for floating gate electrodes in the regions from which the pad nitride films are removed; and forming patterns for forming cylinder-shaped floating gate electrodes on the second silicon films, and performing an etch process on the second silicon films using the patterns as etch masks to form the cylinder-shaped floating gate electrode patterns on the first silicon films for floating gate electrodes.

2. The method as claimed in claim 1, wherein the cylinder-shaped floating gate electrode patterns are located between the isolation films, which are regions from which the pad nitride films are removed.

3. The method as claimed in claim 1, further comprising the step of forming a dielectric film on the entire surface including the cylinder-shaped floating gate electrode patterns.

4. The method as claimed in claim 3, wherein the dielectric film is formed to be in contact with top portions and lateral portions of the cylinder-shaped floating gate electrodes.

* * * * *